United States Patent
Ciemniak

(10) Patent No.: US 6,759,897 B2
(45) Date of Patent: Jul. 6, 2004

(54) CIRCUIT FOR REDUCING SECOND AND THIRD ORDER INTERMODULATION DISTORTION FOR A BROADBAND RF AMPLIFIER

(75) Inventor: Hartmut Ciemniak, Holle (DE)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 10/303,611

(22) Filed: Nov. 25, 2002

(65) Prior Publication Data

US 2003/0080808 A1 May 1, 2003

Related U.S. Application Data

(63) Continuation of application No. 09/617,610, filed on Jul. 17, 2000, now Pat. No. 6,509,789, which is a continuation-in-part of application No. 09/489,625, filed on Jan. 24, 2000, now Pat. No. 6,466,084.

(51) Int. Cl.[7] ............................... H03B 1/00; H03F 5/00
(52) U.S. Cl. ........................ 327/553; 327/307; 327/317
(58) Field of Search ........................ 327/307–311, 317, 327/362, 512–513, 551–555; 330/149, 295; 455/114, 291, 296, 302, 276; 359/161

(56) References Cited

U.S. PATENT DOCUMENTS

| | | | |
|---|---|---|---|
| 4,808,810 A | 2/1989 | Van Doorn | 250/214 A |
| 4,882,482 A | 11/1989 | Smith et al. | 330/308 |
| 4,992,754 A | 2/1991 | Blauvelt et al. | 330/149 |

(List continued on next page.)

FOREIGN PATENT DOCUMENTS

| | | |
|---|---|---|
| DE | 2656436 | 6/1978 |
| DE | 3024533 | 1/1982 |
| DE | 3338024 | 5/1985 |

(List continued on next page.)

OTHER PUBLICATIONS

Optical Receiver Front–End Nonlinear Distortion, Electronics Letters, Apr. 29, 1982, vol. 18, No. 9, pp. 361–362.
Bertelsmeier et al., Linearization of Broadband Optical Transmission Systems by Adaptive Predistortion, 1984, pp. 206–212.
Ha, Solid–State Microwave Amplifier Design, pp. 202–217.
Ohr, GaAs Finds Home in Wireless & High–Speed Data–Communications Applications, Computer Design, Mar. 1994, pp. 59–68.

(List continued on next page.)

*Primary Examiner*—My-Trang Nu Ton
(74) *Attorney, Agent, or Firm*—Volpe and Koenig, P.C.

(57) ABSTRACT

A controllable apparatus for providing a compensated RF signal including an input port for coupling with an RF signal source, such as a multifrequency CATV signal, and an output port for coupling to an associated electronic device. The controllable apparatus generates new second and third order products from the multifrequency RF signal which are the same magnitude, but opposite in phase to the nonlinear products generated by the electronic device. Since both the original multifrequency RF input signal and the new generated products from the distortion control circuit are coupled to the electronic device, the nonlinear products from the distortion control circuit and the electronic device will be canceled and the output of the electronic device will comprise only the multifrequency RF signal. The controllable apparatus includes an RF circuit path and a controllable nonlinear compensator transversely connected to the RF circuit path. A control bias input allows selective control of the nonlinear compensator.

9 Claims, 5 Drawing Sheets

U.S. PATENT DOCUMENTS

| | | | |
|---|---|---|---|
| 4,998,012 A | 3/1991 | Kruse | 455/619 |
| 5,161,044 A | 11/1992 | Nazarathy et al. | 359/157 |
| 5,172,068 A | 12/1992 | Childs | 330/149 |
| 5,321,710 A | 6/1994 | Cornish et al. | 372/26 |
| 5,361,156 A | 11/1994 | Pidgeon | 359/161 |
| 5,418,637 A | 5/1995 | Kuo | 359/161 |
| 5,424,680 A | 6/1995 | Nazarathy et al. | 330/149 |
| 5,455,705 A | 10/1995 | Gusinov | 359/189 |
| 5,523,716 A | 6/1996 | Grebliunas et al. | 330/149 |
| 5,568,087 A | 10/1996 | Gatti | 330/149 |
| 5,572,161 A | 11/1996 | Myers | 327/538 |
| 5,589,797 A | 12/1996 | Gans et al. | 330/149 |
| 5,600,472 A | 2/1997 | Uesaka | 359/161 |
| 5,703,530 A | 12/1997 | Sato et al. | 330/149 |
| 5,752,174 A | 5/1998 | Matai et al. | 455/183.1 |
| 5,798,854 A | 8/1998 | Blauvelt et al. | 359/161 |
| 5,850,305 A | 12/1998 | Pidgeon | 359/187 |
| 5,909,642 A | 6/1999 | Suzuki | 455/114 |
| 5,939,920 A * | 8/1999 | Hiraizumi | 327/306 |
| 6,069,534 A | 5/2000 | Kobayashi | 330/308 |
| 6,107,877 A | 8/2000 | Miguelez et al. | 330/66 |
| 6,122,085 A | 9/2000 | Bitler | 359/180 |
| 6,204,718 B1 | 3/2001 | Pidgeon | 327/318 |

FOREIGN PATENT DOCUMENTS

| | | |
|---|---|---|
| DE | 4212772 | 10/1993 |
| EP | 0498456 | 2/1992 |
| EP | 0552316 | 2/1992 |
| EP | 0486953 | 5/1992 |
| EP | 0620661 | 10/1994 |
| GB | 1381597 | 1/1975 |
| GB | 2164515 | 3/1986 |
| WO | 9735390 | 9/1997 |

OTHER PUBLICATIONS

Eggers, 2GHz Bandwidth Predistortion Linearizer For Microwave Power Amplifiers At Ku–Band, pp. 1501–1505, Sep. 1994.

Eggers, Pamela—Linearized Solid State Power Amplifier At Ku–band Frequency, pp. 443–445, Sep. 1993.

Khilla et al., Semiconductor Transmitter Amplifiers And Traveling Wave Tube Linears For Future Communications Satellites, 8273 ANT Telecommunications Engineering Reports, No. 8, Feb. 1991 (including English translation).

Locatelli et al., Microwave Linear Power Amplifier With Micromodule Technology, pp. 1.3.1–1.3.6, Jun. 1987.

Kobayashi et al., A Novel Monolithic Linearized HEMT LNA Using HBT Tuneable Active Feedback, IEEE MTT–S International Microwave Symposium Digest, pp. 1217–1220, Jun. 1996.

* cited by examiner

CIRCUIT FOR REDUCING SECOND AND THIRD ORDER INTERMODULATION DISTORTION FOR A BROADBAND RF AMPLIFIER

CROSS REFERENCE TO RELATED APPLICATIONS

This application is a continuation of U.S. patent application Ser. No. 09/617,610, filed Jul. 17, 2000, now U.S. Pat. No. 6,509,789, which is a continuation-in-part of U.S. patent application Ser. No. 09/489,625 filed Jan. 24, 2000, U.S. Pat. No. 6,466,084 issued Oct. 15, 2002.

BACKGROUND

This invention relates generally to radio frequency (RF) amplification. More particularly, the invention relates to a system for reducing second and third order intermodulation distortion in broadband CATV RF amplifiers.

Lowering distortion in RF power amplifier circuits without compromising their transient response is an omnipresent problem. High frequency amplification is widely used in communications and broadcasting and also where high-speed switching is required for use in digital instrumentation. However, high frequency amplifier applications extend linear operation into areas where parasitic effects of inter-electrode capacitance, wire inductance, stored charge and even operating frequency wavelength begin to adversely affect and dominate circuit behavior.

Minimizing distortion is particularly important when a series of amplifiers is cascaded over a signal transmission path, such as a series of RF amplifiers in a CATV transmission network. Disposed throughout a CATV transmission system are RF amplifiers that periodically amplify the transmitted signals to counteract cable attenuation and attenuation caused by passive CATV components, such as signal splitters and equalizers. The RF amplifiers are also employed to maintain the desired carrier-to-noise ratio. Due to the number of RF amplifiers employed in a given CATV transmission system, each RF amplifier must provide minimum degradation to the transmitted signal.

In an ideal communication system it is preferable that the components which comprise the system are linear. However, as a practical reality, there are many nonlinearities that are typically introduced by the electronic components, such as RF amplifiers. The distortions created by an RF amplifier which are of primary concern are second (even) and third (odd) order harmonic distortions. Prior art amplifier designs have attempted to ameliorate the effects of even order distortions by employing push-pull amplifier topologies, since the maximum even order cancellation occurs when the proper 180° phase relationship is maintained over the entire bandwidth. Although this is often achieved through equal gain in both push-pull halves by matching the operating characteristics of the active devices, it is still desirable to have a circuit which is able to generate second order distortions in order to compensate for second order distortions which originate from within or outside of the amplifier. An amplifier having second order distortion correction capabilities would be suitable for use in many applications, such as with lasers or nonlinear quadripoles.

Odd-order distortion characteristics of an amplifier are manifest as cross modulation (X-mod) and composite triple beat (CTB) distortions on the signal being amplified. These are two types of intermodulation (IM) distortion. X-mod occurs when the modulated contents of one channel being transmitted interferes with and becomes part of an adjacent or non-adjacent channel. CTB results from the combination of three frequencies of carriers occurring in the proximity of each carrier since the carriers are typically equally spaced across the frequency bandwidth. Of the two noted distortions, CTB becomes more problematic when increasing the number of channels on a given CATV system. While X-mod distortion also increases in proportion to the number of channels, the possibility of CTB is more dramatic due to the increased number of available combinations from among the total number of transmitted channels. As the number of channels transmitted by a communication system increases, or as the channels reside closer together, the odd-order distortion becomes a limiting factor of amplifier performance.

The nonlinear properties of an RF amplifier can be described by a curve which can be expanded into a Taylor series as follows:

$$U_{out} = a_1 \cdot U_{in} + a_2 \cdot U_{in}^2 + a_3 \cdot U_{in}^3 + a_4 \cdot U_{in}^4 + a_5 \cdot U_{in}^5 \ldots a_n \cdot U_{in}^n,$$ Equation 1 where $U_{in}$ is the input potential and Uout is the output potential and $a_n$ is a factor that determines the magnitude of the term. It should be noted that $a_1 \cdot U_{in}$ is the 1st order term; $a_2 \cdot U_{in}^2$ is the 2nd order term; $a_3 \cdot U_{in}^3$ is the 3rd order term ... and $a_n \cdot U_{in}^n$ is the nth order term. The magnitudes of the individual terms are strongly dependent on the input signal and, therefore, on the level control of the amplifier.

If we have the following:

$$U_{in} = A \cdot \cos \omega_i t$$ Equation 2

There exists for each term multiple combination possibilities of the input circulating frequencies $\omega_i$ due to the power of the corresponding order number. Additionally, in multifrequency transmission systems, such as a CATV transmission network, the number of new circulating frequencies at the output of the network increases exponentially with the number (i) of frequencies at the input. These new circulating frequencies, both second and third order products, are referred to herein as intermodulation (IM) products and are detrimental to the accurate acquisition of CATV signals.

Using the Taylor series, it can be demonstrated that all odd order terms create products which appear at the same location as the lower-valued odd order terms. Therefore, the third order term creates a product at the base frequency, (odd order number 1), the fifth order term creates a product at the third order and one at the base frequency. If the input signal consists, for example, of the base circulating frequencies $\omega_1$ and $\omega_2$ (i=2) with the same amplitude A, that is expressed with:

$$U_{in} = A\cos(\omega_1 t) + A\cos(\omega_2 t)$$
$$= 0.5\ A(e^{j\omega_1 t} + e^{-j\omega_1 t} + e^{j\omega_2 t} + e^{-j\omega_2 t}),$$ Equation 3 then the third order term $a_3 \cdot U_{in}^3$ of Equation 1 creates the following new products: $\pm \omega_1$; $\pm \omega_2$; $\pm 3\omega_1$; $3\omega_2$; $\pm(2\omega_2 \pm \omega_1)$; $\pm(2\omega_1 \pm \omega_2)$ In this case there are 16 new frequencies due to two input circulating frequencies. The second order term $a_2 \cdot U_{in}^2$ of Equation 1 creates the following new products: $2\omega_1$; $2\omega_2$; $\omega_2 - \omega_1$; $\omega_1 + \omega_2$.

A "weakly" nonlinear transmission system can be defined such that: a) the effect of odd order terms on other lower-valued odd order terms is negligibly small; and b) higher-valued terms after the third order term are negligibly small. Accordingly, a weakly nonlinear system may be mathematically described such that the Taylor series is broken off after the third order term, ($a_3 \cdot U_{in}^3$). Weakly nonlinear systems are characterized in that a 1 db increase in the level of the input circulating frequencies $\omega_i$ causes an increase of 3 db in the third order IM products.

Communication systems, such as CATV systems which include broadband RF amplifiers, are further regarded as dynamically nonlinear systems whereby the amplitudes and phases of the IM products are dependent upon the input frequencies.

There are three basic ways of correcting distortion created by a non-linear device: 1) reduce the signal power level; 2) use a feed forward technique; and 3) use a predistortion or postdistortion technique. The first method reduces the signal power level such that the non-linear device is operating in its linear region. In the case of an RF amplifier this results in very high power consumption for low RF output power. Of course, the high power consumption is a disadvantage. However, this method is not an option if high output level is required on a permanent basis.

The second method is the feed forward technique. Using this technique, the input signal of the main amplification circuit is sampled and compared to the output signal to determine the difference between the signals. This difference is the distortion component which is amplified by an auxiliary amplification circuit and combined with the output of the main amplification circuit such that the two distortion components cancel each other. However, the power consumed by the auxiliary amplification circuit is comparable to that consumed by the main amplification circuit and the circuitry is also complex and expensive. At the upper frequency limit it is very difficult to maintain the magnitude and phase conditions with respect to temperature.

The third method is the pre- or post-distortion technique. Depending upon whether the compensating distortion signal is generated before the non-linear device or after, the respective term predistortion or postdistortion is used. In this technique, a distortion signal equal in amplitude but opposite in phase to the distortion component generated by the amplifier circuit is estimated and generated. This is used to cancel the distortion at the input (for predistortion) or output (for postdistortion) of the amplifier, thereby improving the operating characteristics of the amplifier.

SUMMARY

The present invention is a distortion control circuit for selective modulation of an RF signal. The present invention includes an input port for coupling with an RF signal source, such as a multifrequency CATV signal, and an output port for coupling to an associated electrical circuit such as a hybrid RF amplifier, a laser or any other nonlinear quadrapole. The present invention generates new second and third order products from the multifrequency RF signal which are the same magnitude, but opposite in phase to the nonlinear products generated by the hybrid RF amplifier, laser or nonlinear quadrapole, (hereinafter "electronic device"). Since both the original multifrequency RF input signal and the new generated products from the invention are coupled to the electronic device, the nonlinear products from the present invention and the electronic device will be canceled and the output of the electronic device will comprise only the multifrequency RF signal. The distortion control circuit includes a nonlinear circuit having a pair of diodes which are selectively biased to create second and third order distortion products for adding to the input signal. The present inventive circuit is particularly adaptable weakly nonlinear systems and provides the ability to largely match the dynamically nonlinear behavior of a system to be compensated and achieve compensation over a frequency range of at least 860 MHz.

DETAILED DESCRIPTION OF THE PREFERRED EMBODIMENTS

Figure 1A:
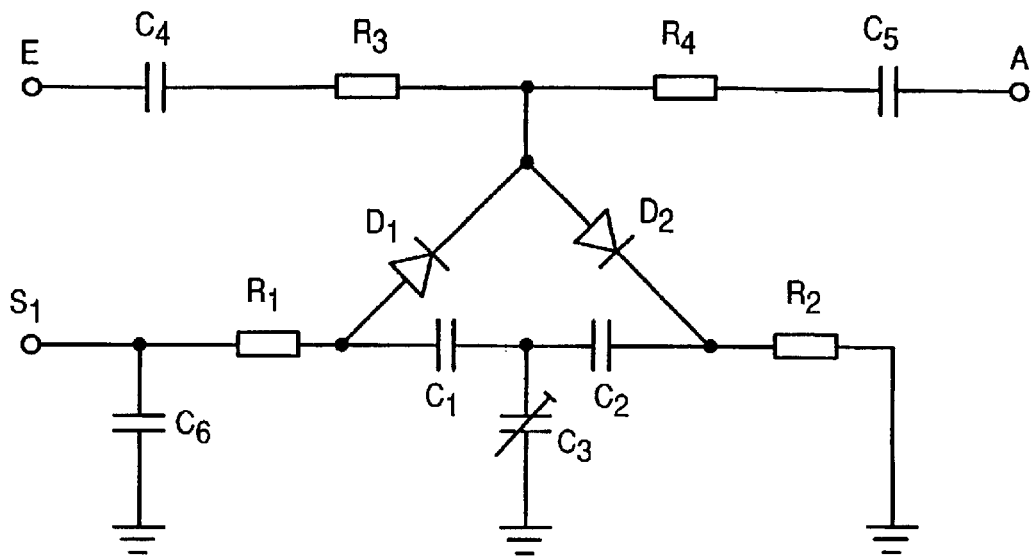
FIGS. 1A and 1B are schematic diagrams of circuits for reducing third order distortion in accordance with the present invention.

The preferred embodiment of the present invention will be described with reference to the drawing figures where like numerals represent like elements throughout.

One basic structural element for a compensator is a nonlinear element. In accordance with the present invention, the nonlinear element is preferably a Schottky diode pair. Diode current $I_F$ and diode voltage $U_F$ are generally related by the following equation:

$$I_F = I_0(e^{U_F/m \cdot U_T} - 1); \qquad \text{Equation 4}$$

where: $I_F$ is the diode forward current; $I_0$ is the diode inverse current; $U_F$ is the diode forward voltage; m is a correction factor with a value between 1 and 2; and $U_T$ is the temperature dependent voltage which can be written as:

$$U_T = \frac{k \cdot T}{e_o}; \qquad \text{Equation 5}$$

whereby: k=Boltzmann's–constant (physical constant);
T=temperature in kelvin; and
$e_o$=electrical element charge (physical constant).

Accordingly, $U_T$ is a constant for a certain temperature, (for example, 25 mV at 23° C.). The Taylor series of an exponential function yields relatively large second and third order terms. This is expressed in Equation 6 whereby the last term is the third order term and the next-to-last term is the second order term.

$$e^x \cong 1 + \frac{x}{(1!)} + \frac{x^2}{(2!)} + \frac{x^3}{(3!)} \qquad \text{Equation 6}$$

Equation 4 can be approximated by:

$$I_F \approx I_0 e^{kU_F} \qquad \text{Equation 7}$$

Which means that the diode forward current $I_F$ is proportional to an e-function with the diode forward voltage $U_F$ in its exponent. Since the diode is part of the inventive circuit, $U_F$ is part of $U_{in}$ and Equation 7 can be rewritten as:

$$I_F \approx I_0 e^{k \cdot U_{in}} \qquad \text{Equation 8}$$

Assuming that $k \cdot U_{in}$ is x, and inserting it into Equation 6, the third order term $x^3/3!$ and the second order term $x^2/2!$ will produce the same products, (i.e., compensating products generated by the diode), as shown by Equation 1.

To achieve phase opposition of the compensating IM products relative to those of the object to be compensated, the nonlinear element is connected in accordance with the preferred embodiment of the present invention in the transverse branch of a T-member as shown in FIG. 1A. If the nonlinear element was arranged in the length branch of an equivalent T-member, the IM products would be in phase relative to those to be compensated, (provided the diodes in the two cases operate at the same operating points), and compensation would be impossible.

The system 10 for reducing second and third order IM products in accordance with the present invention is located between an input E and an output A. The input E comprises a multifrequency operating signal, for example a CATV signal having plurality of CATV channels. The output A is connected to a system to be compensated, for example a hybrid RF amplifier, a laser or any other nonlinear quadrapole. For simplicity, however, the system will be explained hereinafter with reference to the example of being connected to an RF amplifier. As is well known by those skilled in the art the RF amplifier not only amplifies the output A, but also may introduce undesired second and third order IM products. These IM products are compensated for by the present invention. As shown, the system 10 is a circuit which comprises a plurality of resistors $R_1$, $R_2$, $R_3$, $R_4$; a plurality of capacitors $C_1$, $C_2$, $C_3$, $C_4$, $C_5$, $C_6$; and a nonlinear element comprising two Schottky barrier diodes $D_1$, $D_2$. As will be explained in detail hereinafter, the present invention produces second and third order "compensating" IM products, (including cross-modulation products), which exhibit the same amplitude but opposite phase to the undesired RF amplifier-generated IM products. The compensating IM products are added at the node connecting the two resistors $R_3$ and $R_4$ and the two diodes $D_1$ and $D_2$ such that the compensating IM products are added to the multifrequency operating signal and output at output A.

A first control input $S_1$ is provided to control the operating point of the diodes $D_1$, $D_2$ and thereby control the magnitude of compensating IM products. At the first control input $S_1$, a direct current (DC) is supplied which flows through diodes $D_1$ and $D_2$ and determines the operating point of the diodes $D_1$, $D_2$, A DC current change at the control input $S_1$ influences the steepness of the diode characteristic. The change in the diode differential forward resistance $R_F$ in the lower segment of the diode characteristic is greater than in the upper segment, provided that the change of $I_F$ is the same in both cases.

Figure 2:
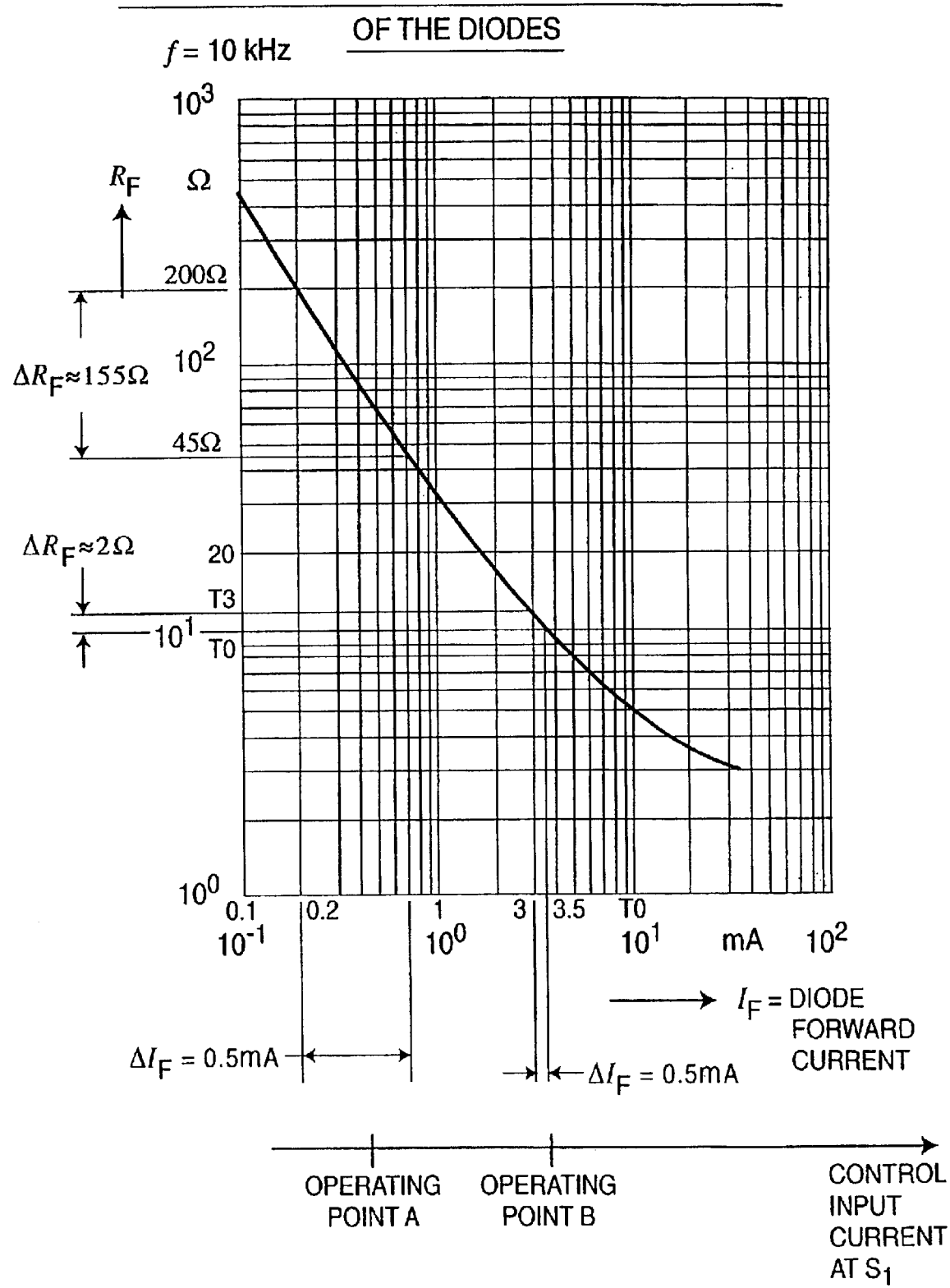
FIG. 2 is a graph of the diode differential forward resistance $R_F$ verses the diode forward current $I_F$.

A graph of the diode differential forward resistance $R_F$ verses the diode forward current $I_F$ is shown in FIG. 2. It should be noted that this curve is an illustration of the frequency response at 10 KHz. As shown, the diode differential forward resistance $R_F$ is dependent upon both the diode operating point and the change in diode forward current $I_F$. For example, the DC current at the first control input $S_1$ changes the operating point of the diodes $D_1$, $D_2$ from operating point A to operating point B. At operating point A, a change in the diode forward current $I_F$ of 0.5 mA results in a change in the diode differential forward resistance $R_F$ of 155Ω. However, at operating point B, a change in the diode forward current $I_F$ of 0.5 mA results in a change in the diode differential forward resistance $R_F$ of only 2Ω. The differential diode current $\Delta I_F$ is caused by the input level $U_{in}$. Since $U_{in}$ is an RF signal, it leads to an alternating diode current, as shown in Equation 8.

The magnitude of the compensating IM products is dependent upon the change in diode differential forward resistance $R_F$ as a function of the level of $U_{in}$. Accordingly, a low DC current at the first control input $S_1$ leads to a greater magnitude of compensating IM products, and a high DC current at the first control input $S_1$ correspondingly leads to a smaller magnitude of compensating IM products. By selectively controlling the DC current at the first control input $S_1$, the magnitude of the compensating IM may be selectively controlled. As will be described in greater detail hereinafter, separately biasing each diode $D_1$, $D_2$ enables the present invention to selectively control the amount of second and third order distortion that is created.

Figure 3:
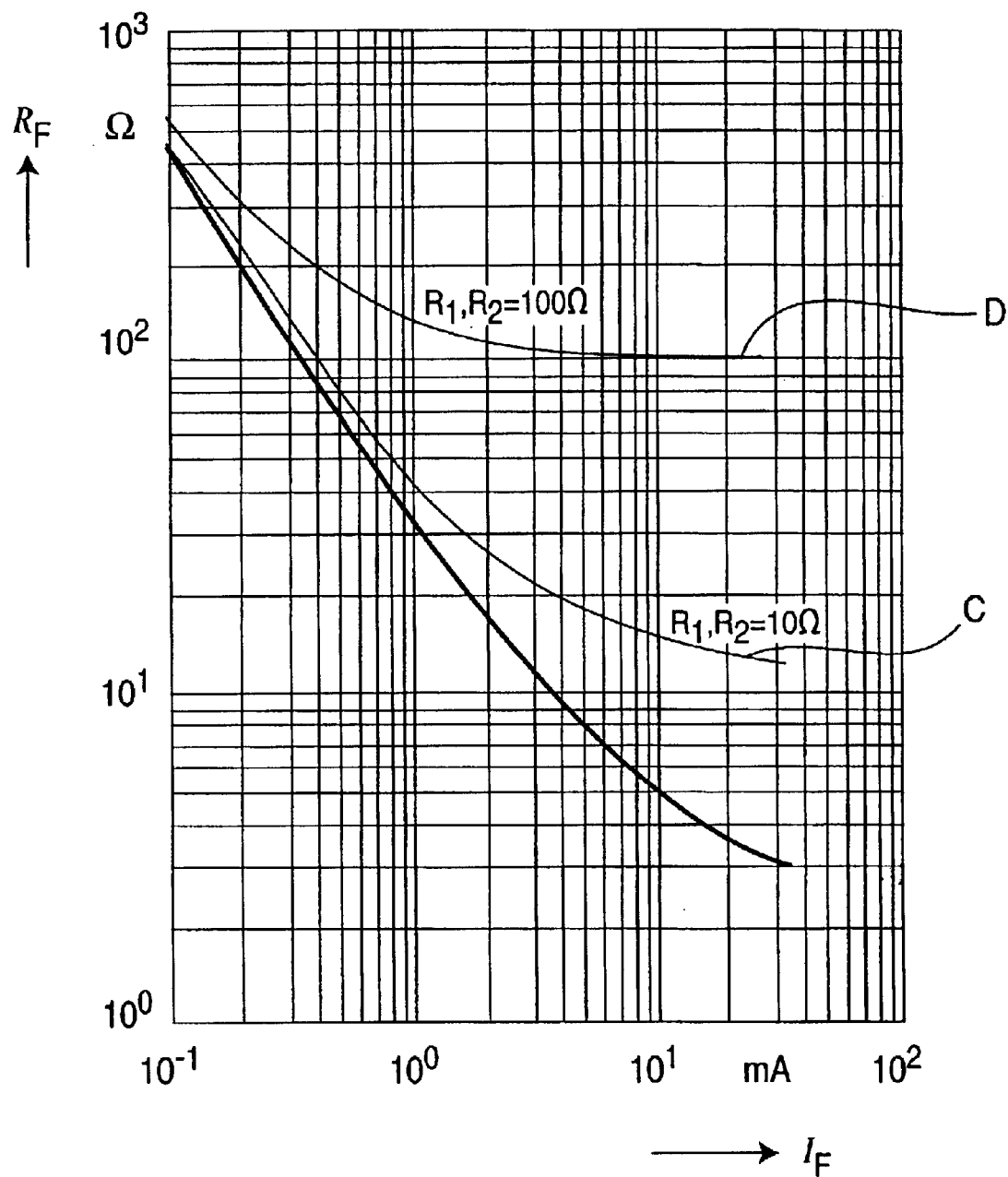
FIG. 3 is a graph of the diode differential forward resistance $R_F$ verses the diode forward current $I_F$ with different resistors in series with the diode.

In accordance with the present invention, an additional method for adjusting the diode differential forward resistance $R_F$ characteristic is provided by the introduction of the resistors $R_1$ and $R_2$, which from an AC standpoint are in series with $D_1$ and $D_2$. The signal currents are conducted from $D_2$ via $R_2$ directly to ground and from $D_1$ via $R_1$ and $C_6$ to ground. $C_6$ is a blocking capacitor whose complex resistance is negligibly small for all applied frequencies of the multifrequency input signal. The resistors $R_1$ and $R_2$ affect the diode differential forward resistance $R_F$ characteristic by flattening the characteristic, thereby influencing the magnitude of the compensating IM products. Referring to FIG. 3, a graph of the diode differential forward resistance $R_F$ verses the diode forward current $I_F$ is shown. It can clearly be seen that as the value of the two resistors $R_1$, $R_2$ is increased from 10Ω to 100Ω, the diode differential forward resistance $R_F$ characteristic changes from curve C to curve D.

In one embodiment of the present invention it is desired to eliminate the generation of second order compensating IM products. This is accomplished by ensuring that the compensating IM products generated by the diodes $D_1$, $D_2$ are equal. In this embodiment, circuit symmetry is required. Therefore, the resistors $R_1$, $R_2$ have the same values and simultaneously play the role of symmetry resistors, in that they equalize the potentially different diodes $D_1$, $D_2$. The symmetry resistors $R_1$ and $R_2$ decouple the two diodes $D_1$, $D_2$ from each other and lead to symmetrical compensating IM products. In this manner, any deviations in the characteristics of both diodes $D_1$, $D_2$ are minimized.

In an alternative embodiment where it is desired to generate second order compensating IM products, the bias on each of the diodes $D_1$, $D_2$ is different. Accordingly, for every RF positive cycle and negative cycle, the compensating products generated by $D_1$ will be different than the compensating products generated by $D_2$. In this manner, in addition to providing third order correction, the present circuit will also provide second order correction.

The diode differential forward resistance $R_F$ is frequency dependent due to the complex parasitic effects of the diodes $D_1$, $D_2$. As the diode current $I_F$ decreases, the influence of the parasitic elements increases. The detrimental diffusion capacitance of the diodes $D_1$, $D_2$, (which parallels the diode differential forward resistance $R_F$), prevents the signal energy at the upper frequency limit from entering into the diode differential forward resistance $R_F$. This leads to a reduction of the compensating IM products at high frequencies. Unfortunately, a high level of compensating IM products is particularly required at high frequencies because the IM products in RF amplifiers inherently increase with signal frequency due to the circuit-produced reverse coupling, which becomes less effective at high frequencies.

In order to counteract the parasitic effects, capacitors $C_1$, $C_2$ and $C_3$ are provided. The common variable capacitor $C_3$ is used to match the frequency distribution of the IM products of the RF amplifier, thereby achieving optimal broadband compensation. By providing the equalizing element $C_3$, the required symmetry conditions can always be obtained independently of its adjustment. The capacitors $C_4$ and $C_5$ serve exclusively for blocking the direct components at the input E and output A, and their capacitances are large enough such that they do not affect the multifrequency operating signal. Together with $R_1$ and $R_2$, the capacitors $C_1$, $C_2$ and $C_3$ provide frequency-dependent resistances, such that they permit a desired and controllable level of increase of the compensating IM products at high frequencies. The flattening of the diode characteristic at high frequencies is counteracted by the reduction of the complex series resistances. As a result, the diode characteristic steepens not only at high frequencies, but an increase in steepness can also be realized if desired.

In accordance with the teachings of the present invention, an improvement of 8 db to 15 db in CTB and X-mod may be expected depending upon the hybrid RF amplifier to which the system 10 is coupled.

Figure 1B:
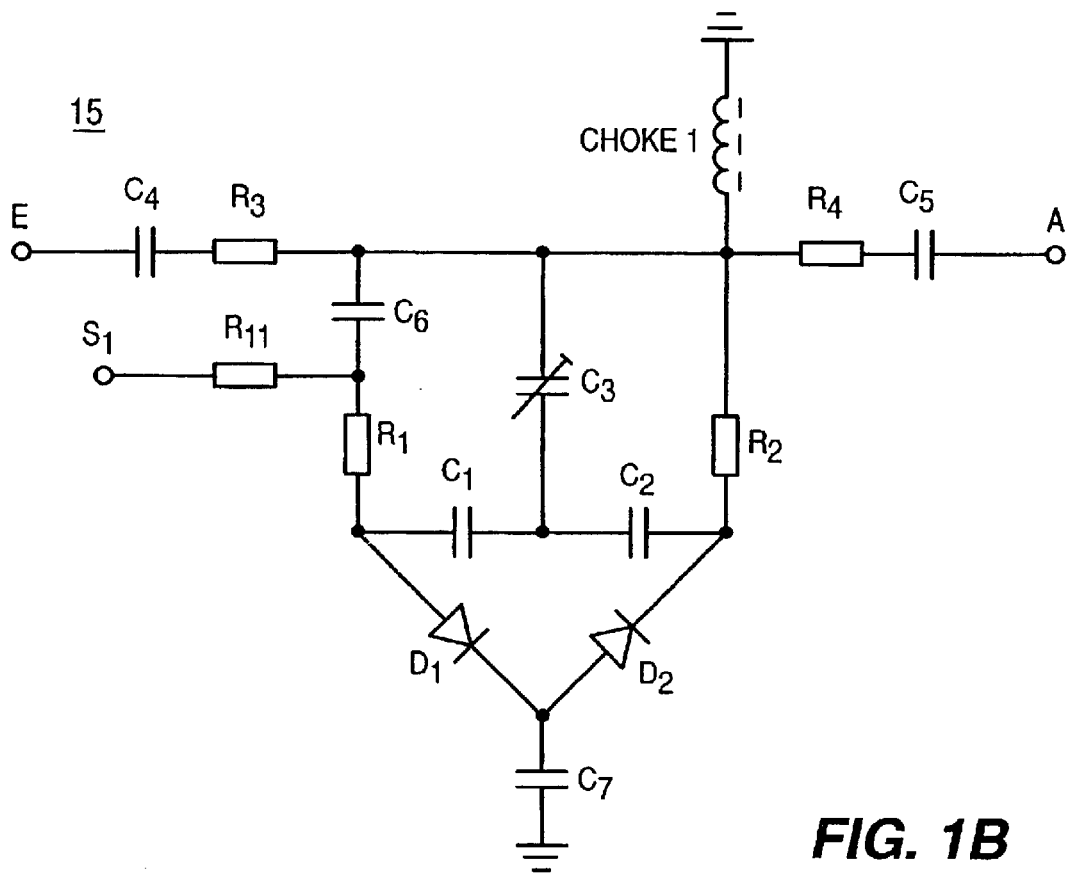

An alternative embodiment 15 of the present invention is shown in FIG. 1B. This embodiment 15 is similar to the embodiment shown in FIG. 1A except that the ground connections have essentially been exchanged with the input and output. In this embodiment, R11 is part of the first DC control input $S_1$, $C_7$ is a blocking capacitor, and choke 1 is a path only for the DC current from the control input $S_1$. This embodiment 15 operates in the same manner and achieves the same results as the embodiment 10 shown in FIG. 1A.

Figure 4:
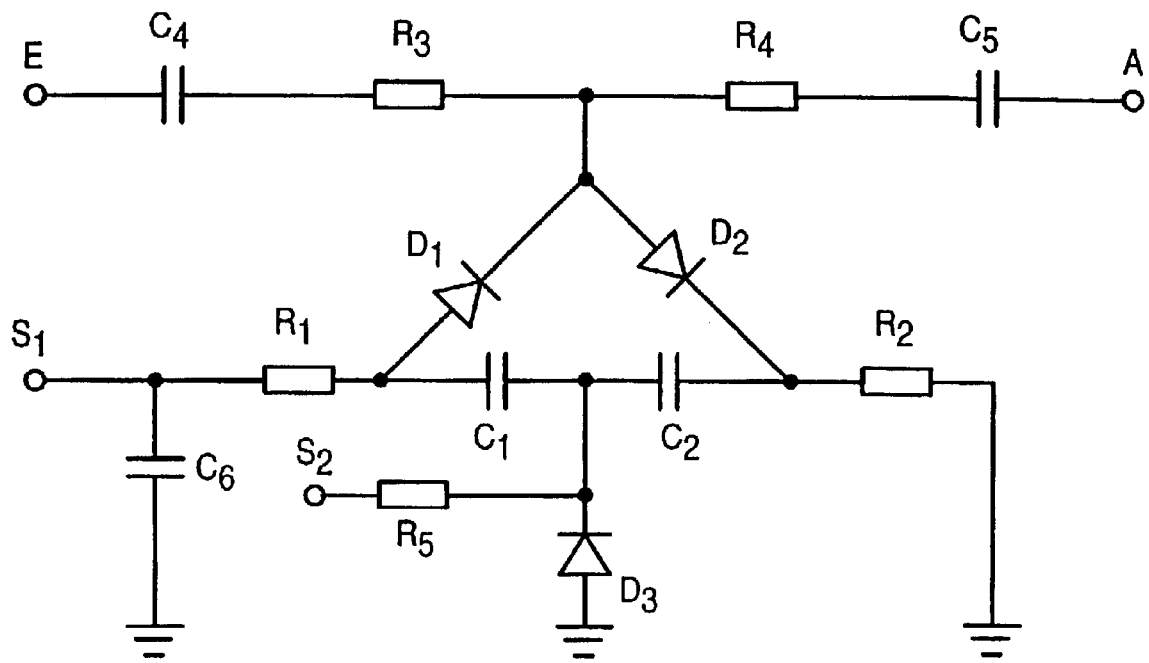
FIG. 4 is an alternative embodiment of the present invention.

Another alternative embodiment 20 of the present invention is shown in FIG. 4. In this alternative embodiment 20, $C_3$ is replaced by the variable capacitance diode $D_3$. An input $S_2$ is provided for connection to a variable DC voltage. This permits electrical adjustments, for example, when the circuit 20 is integrated into a hybrid RF amplifier. The value of $R_5$ is chosen to be very high so that there is no adverse influence to the RF transmission behavior of the distortion system, (i.e., no adverse influence on insertion loss and return loss over the range of operating frequencies).

Figure 5:
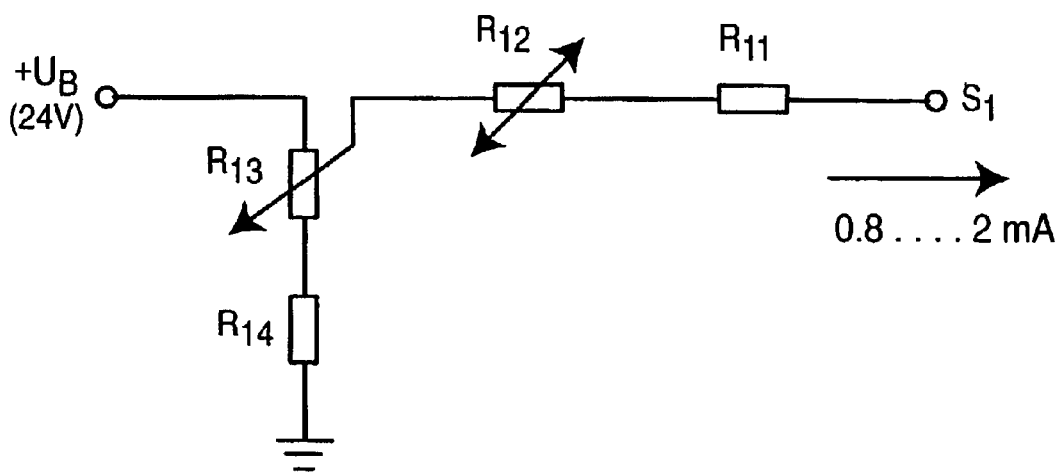
FIG. 5 is a bias control for the present invention.

Referring to FIG. 5, a bias control 30 for the input $S_1$ of FIGS. 1A, 1B and 4 is shown. The input voltage $+U_B$ is the operating voltage which has a fixed value. In the present case, the fixed value is 24 volts DC, which corresponds to the operating voltage of a hybrid RF amplifier. As those skilled in the art would appreciate, the value of $+U_B$ may be different in other applications. $R_{12}$ is a resistor with a positive temperature coefficient to compensate temperature effects. With the insertion of $R_{12}$ it is possible to realize temperature compensation of the RF hybrid, (i.e., increased compensation as the temperature increases). It should be noted that although $R_{12}$ improves the temperature behavior, this resistor is optional. Since $R_{13}$ is variable, it permits adjustment of the compensation effect of the IM products.

Table 1 below sets forth the component values for the components shown in FIGS. 1, 4, 5 and 6. It should be clearly recognized by those skilled in the art that these component values have been selected for the particular application and desired frequency range. These component values are illustrative only and should not be considered to be an essential part of the present invention since they will change depending upon the operating range of the system in which the distortion circuit is utilized and the amplifier to which the distortion circuit is coupled. The values should not be viewed as limiting.

TABLE 1

| Component | Value |
| --- | --- |
| $C_1$ | 0.5 pF |
| $C_2$ | 0.5 pF |
| $C_3$ | 0.5–2 pF |
| $C_4$, $C_5$, $C_6$, $C_7$ | 1 nF |
| $R_1$, $R_2$ | 300 Ω to 750 Ω (dependent on application) |
| $R_3$, $R_4$ | 3.9 Ω |
| $R_5$ | 10 kΩ–100 kΩ |
| $D_1$, $D_2$ | Schottky barrier diode pair |
| $D_3$ | Hyperabrupt variable capacitance diode from 0.5–2.0 pF |
| $S_1$ bias current | 0.8 mA to 2 mA |
| $R_{11}$ | 7.5 kΩ |
| $R_{12}$ | 2 kΩ |
| $R_{13}$ | 20 kΩ |
| $R_{14}$ | 7.5 kΩ |
| choke$_1$ | 1000 nH |

The preferred embodiment of the present invention comprises anti-parallel connected diode branches $D_1$, $D_2$ whereby the second order products produced in each branch cancel each other out since their individual signals are oppositely phased. However, an asymmetry maybe intentionally created resulting in second order products which appear at the output A of the circuit. The magnitude of these products depends upon the degree of asymmetry and the DC current in the control input $S_1$; whereas the phase 0°/180° depends on the weighting of the components from both diode branches $D_1$, $D_2$. This assumes that $D_1$ causes products at 0° and $D_2$ causes products at 180° (opposite phase).

Figure 6:
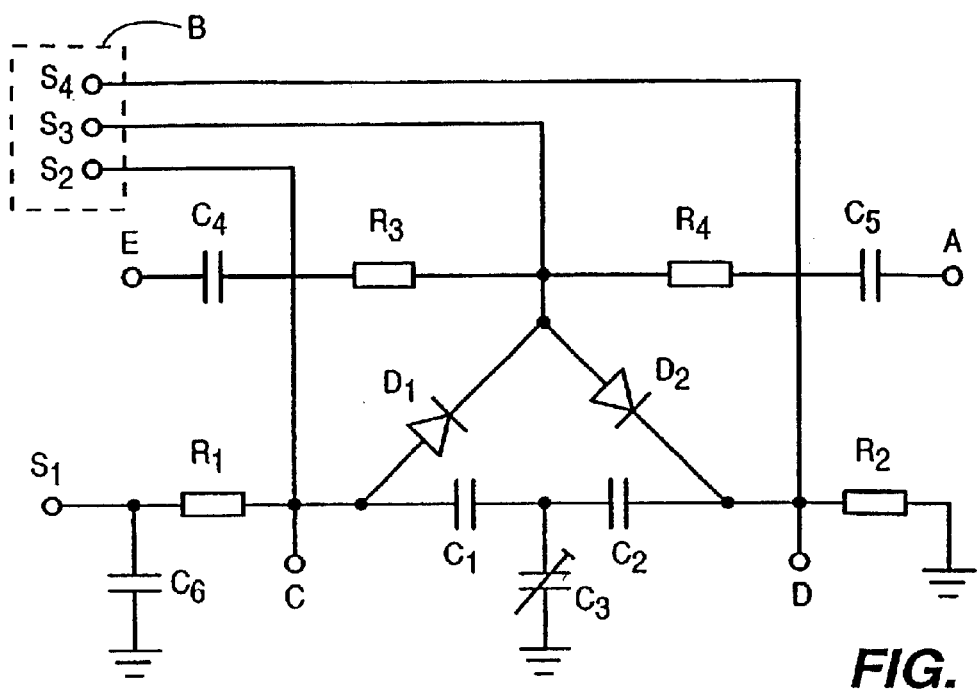
FIG. 6 is a schematic diagram of a circuit for reducing second and third order distortion in accordance with the present invention.

Referring to FIG. 6, an alternative embodiment for also correcting second order distortion is shown. It should be recognized that in this embodiment, a bias control B makes the bias across the diodes $D_1$, $D_2$ different with respect to each other such that diode $D_1$ produces a different amount of compensating products than diode $D_2$. In this embodiment, three additional inputs $S_2$, $S_3$ and $S_4$ are provided from the bias control B to control the amount of DC current supplied to the diodes $D_1$ and $D_2$. Controlling the amount of DC current across each of diodes $D_1$ and $D_2$ causes diodes $D_1$ and $D_2$ to exhibit different operating points, thereby generating second order IM compensating products that sum together. The three additional inputs $S_2$, $S_3$, $S_4$ are DC current sources, each of which may be selectively controlled and adjusted in order to control the amount of DC current supplied to the diodes $D_1$, $D_2$. Those of skill in the art should recognize that there are a number of different circuits, from very simple to extremely complex, that may be utilized to provide the DC current inputs $S_2$, $S_3$, $S_4$. It is the use of the selectively controlled input $S_1$, $S_3$ and $S_4$ to control the amount of DC current supply to the diodes $D_1$, $D_2$ which is not known in the art. The bias control B is configured such that the sum of the third order products remains substantially constant and that the third order products are further affected only by the control input S1. In accordance with the present invention, the bias control B only effects the generation of second order products. Thus, the present invention achieves the most independent possible relative adjustment of second and third order products and thereby provides practicable equalization. However, several embodiments of DC current inputs $S_2$, $S_3$, $S_4$ for use as a bias control circuit B to selectively control the output of DC current are shown in FIGS. 7A–7C.

Figure 7A:
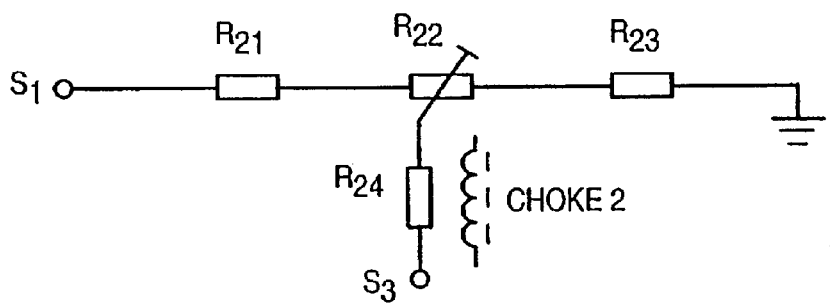
FIGS. 7A–7C are schematic diagrams of bias control circuits for the distortion circuit of FIG. 6.
Figure 7B:
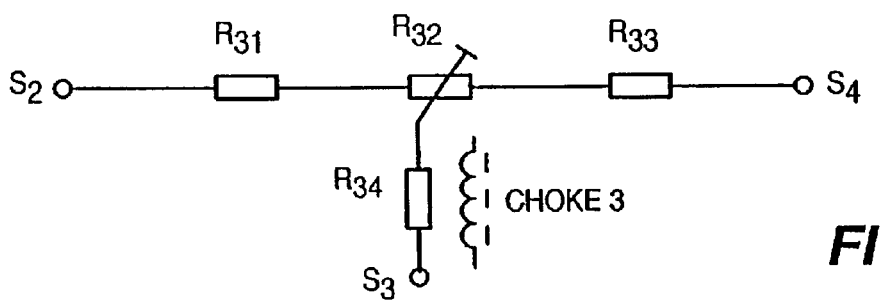

FIG. 7A is a DC current input control circuit for input $S_3$ comprising three resistors $R_{21}$, $R_{23}$, $R_{24}$ and a potentiometer $R_{22}$. Similarly, FIG. 7B is a DC current input control circuit for inputs $S_2$, $S_3$ and $S_4$ comprising resistors $R_{31}$, $R_{33}$ and $R_{34}$ and potentiometer $R_{32}$. Adjustment of the potentiometer controls the amount of DC current from the inputs $S_2$, $S_3$, $S_4$. As shown in FIGS. 7A and 7B, resistor $R_{24}$ can be replaced by $choke_2$ and resistor $R_{34}$ can be replaced by $choke_3$ to provide a pure DC path.

Figure 7C:
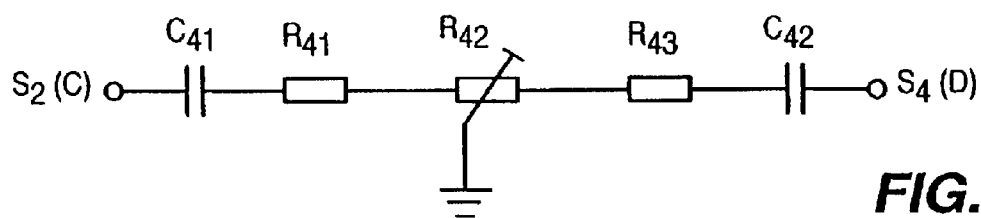

FIG. 7C shows a circuit for inputs $S_2$ and $S_4$ comprising two capacitors $C_{41}$ and $C_{42}$, two resistors $R_{41}$ and $R_{43}$ and a potentiometer $R_{42}$. In this circuit, by setting the potentiometer $R_{42}$ slide to ground, (away from its mid-point setting), an intentional and controlled asymmetry is achieved between the two diodes $D_1$, $D_2$. The resulting resistance components of FIG. 7C are parallel to $R_1$ and $R_2$ from an RF standpoint. The function of $R_1$ and $R_2$ has previously been described hereinbefore. Upon deviation from the mid-point setting of the potentiometer $R_{42}$, there are created different diode differential forward resistances $R_F$ and their accompanying different diode characteristics. As a result, second order products are produced and output at output A whereas in contrast the prevailing diode asymmetry has practically no influence on the sum of the third order products of the two individual diodes because they are in the same phase. If the third order products generated by diode $D_1$ decrease, then the third order products generated by diode $D_2$ increase by the same amount, so that the sum at the connection point of the two diodes $D_1$, $D_2$ remains constant. The capacitance values of $C_{41}$ and $C_{42}$ are selected to be sufficiently great such that they function only to block the DC components.

Alternatively, the value of component $R_1$ may be changed such that it is different than $R_2$, or capacitor $C_1$ may be changed such that it is different than capacitor $C_2$. This may also be accomplished by connecting additional complex resistances or reactions in parallel with resistance $R_1$ or resistance $R_2$. Finally connection of additional different complex resistances or reactances from input point C to ground or input point D to ground. Any of the above-mentioned methods, or a combination thereof may be used to effect the generation of second-order compensating IM products.

Table 2 below sets forth the component values for the components shown in FIGS. 7A–7C. It should be clearly recognized by those skilled in the art that these component values have been selected for the particular application and desired frequency range. These component values are illustrative only and should not be considered to be an essential part of the present invention since they will change depending upon the operating range of the system in which the distortion circuit is utilized and the amplifier to which the distortion circuit is coupled. The values should not be viewed as limiting.

TABLE 2

| Component | Value |
| --- | --- |
| $R_{21}$, $R_{23}$, $R_{31}$, $R_{33}$ | 300 Ω |
| $R_{24}$, $R_{34}$ | 1 kΩ |
| $R_{41}$, $R_{43}$ | 270 Ω |
| $R_{42}$ | 500 Ω |
| $C_{41}$, $C_{42}$ | 1 nF |
| $choke_2$, $choke_3$ | 1000 nH |

It should be noted that all of the circuits described herein and shown in the figures are for a positive supply voltage, and that all circuits can also be configured for negative or symmetrical positive-negative-supply voltages. Although these circuits would have a different layout, they would function in the same manner and achieve the same results as the circuits described herein.

What is claimed is:

1. A controllable apparatus for providing a compensated RF signal to a nonlinear electronic device, which compensates for second and third order intermodulation distortion of the nonlinear electronic device, comprising:

an RF input for receiving an input RF signal;

an output for outputting a compensated RF signal to the nonlinear electronic device;

an RF circuit path coupling said input with said output; and a compensation circuit comprising:

a controllable nonlinear compensator transversely coupled to said RF circuit path for producing intermodulation products which act on the input RF signal to selectively compensate for second and third order distortion; and a control bias input for controlling the operating point of the nonlinear compensator to selectively control the intermodulation products of said nonlinear compensator.

2. The apparatus of claim 1 wherein the nonlinear compensator comprises two diodes coupled together.

3. The apparatus of claim 1 wherein the compensation circuit further comprises:

a biasing circuit coupled to the control bias input for selectively reducing an operating characteristic slope of the nonlinear compensator at a predetermined frequency range, where the operating characteristic is the ratio of resistance to current; and a counteracting circuit coupled in parallel to the nonlinear compensator for counteracting parasitic capacitance of the nonlinear compensator.

4. The apparatus of claim 3 wherein the nonlinear compensator comprises a first diode coupled with a second diode.

5. The apparatus of claim 4 wherein the biasing circuit comprises a first resistor (R1) in series with the first diode and a second resistor (R2) coupled between the second diode and ground.

6. The apparatus of claim 4 whereby the control bias input is used to control third order distortion; and further comprising second, third and fourth control bias inputs for separately adjusting voltage bias across each of the diodes to control second order distortion.

7. The apparatus of claim 6 wherein the third order distortion is improved by approximately 15 dB.

8. The apparatus of claim 3 wherein the counteracting circuit comprises first and second capacitors coupled in series and a third capacitor with first end coupled between first and second capacitors, and second end coupled to ground; whereby the third capacitor is matched to the frequency of the nonlinear electronic device.

9. The apparatus of claim 3 wherein the nonlinear compensator achieves compensation over a frequency range of at least 860 MHz.

* * * * *